US011955472B2

(12) United States Patent
Miao et al.

(10) Patent No.: US 11,955,472 B2
(45) Date of Patent: Apr. 9, 2024

(54) SEMICONDUCTOR-CONTROLLED RECTIFIER WITH LOW TRIGGER VOLTAGE FOR ELECTROSTATIC DISCHARGE PROTECTION

(71) Applicant: GlobalFoundries U.S. Inc., Malta, NY (US)

(72) Inventors: Meng Miao, Williston, VT (US); Alain Loiseau, Williston, VT (US); Souvick Mitra, Essex Junction, VT (US); Wei Liang, South Burlington, VT (US); Robert J. Gauthier, Jr., Williston, VT (US); Anindya Nath, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 143 days.

(21) Appl. No.: 17/554,222

(22) Filed: Dec. 17, 2021

(65) Prior Publication Data

US 2023/0197707 A1 Jun. 22, 2023

(51) Int. Cl.
*H01L 27/02* (2006.01)
*H01L 27/12* (2006.01)
*H01L 29/74* (2006.01)

(52) U.S. Cl.
CPC ...... *H01L 27/0248* (2013.01); *H01L 27/1207* (2013.01); *H01L 29/7436* (2013.01)

(58) Field of Classification Search
CPC ............ H10L 27/0248; H10L 27/1207; H10L 29/7436
See application file for complete search history.

(56) References Cited

U.S. PATENT DOCUMENTS

| | | | |
|---|---|---|---|
| 5,923,067 A | 7/1999 | Voldman | |
| 6,268,992 B1 | 7/2001 | Lee et al. | |
| 6,768,619 B2 | 7/2004 | Ker et al. | |
| 8,399,927 B2 | 3/2013 | Ding et al. | |
| 2008/0218922 A1* | 9/2008 | Mallikararjunaswamy | ................. H01L 27/0262 361/111 |
| 2020/0357788 A1* | 11/2020 | De Conti | ............ H01L 27/1207 |

* cited by examiner

*Primary Examiner* — Tucker J Wright
(74) *Attorney, Agent, or Firm* — Francois Pagette; Hoffman Warnick LLC

(57) ABSTRACT

Disclosed are embodiments of a semiconductor structure that includes a semiconductor-controlled rectifier (e.g., for electrostatic discharge (ESD) protection). The SCR can be readily integrated into advanced semiconductor-on-insulator processing technology platforms (e.g., a fully depleted silicon-on-insulator (FDSOI) processing technology platform) that employ hybrid semiconductor substrates (i.e., semiconductor substrates with both bulk semiconductor and semiconductor-on-insulator regions) and is configured with an on-Pwell semiconductor-on-insulator gate structure that is tied to an anode terminal to effectively lower the SCR trigger voltage. To further lower the trigger voltage of the SCR, the Pwell on which the gate structure sits may be made narrower than the gate structure and/or the doping profile of the Pwell on which the gate structure sits may be graded (e.g., P to P– closer to insulator layer). Additionally, to minimize parasitic capacitance, the gate structure may be shorter in length than contact regions parallel and adjacent thereto.

20 Claims, 7 Drawing Sheets ics/semiconductor-on-insulator regions. The semiconductor structure can further include a semiconductor-controlled rectifier (SCR). The SCR can include, in a first bulk semiconductor region, a first Pwell and a first Nwell positioned laterally adjacent to the first Pwell. The SCR can include, in a second bulk semiconductor region, a second Nwell. The SCR can include, in a semiconductor-on-insulator region positioned laterally between the first bulk semiconductor region and the second bulk semiconductor region, a second Pwell positioned laterally between and abutting the first Nwell and the second Nwell, an insulator layer on the second Pwell, and a semiconductor layer on the insulator layer. Both the second Nwell and the semiconductor-on-insulator region above the second Pwell can be electrically connected to an anode terminal.

SEMICONDUCTOR-CONTROLLED RECTIFIER WITH LOW TRIGGER VOLTAGE FOR ELECTROSTATIC DISCHARGE PROTECTION

BACKGROUND

Field of the Invention

The present invention relates to electrostatic discharge (ESD) protection devices and, more particularly, to embodiments of a silicon-controlled rectifier (SCR) for electrostatic discharge (ESD) protection.

Description of Related Art

Fails due to electrostatic discharge (ESD) negatively impact the reliability of integrated circuits (ICs). IC designs typically include ESD protection devices (e.g., at input/output pads, at power pads, and between power domains). Such ESD protection devices include, but are not limited to, diodes, transistors, and semiconductor-controlled rectifiers (SCRs) (e.g., silicon-controlled rectifiers). At advanced technology nodes, the trigger voltage of such devices and, particularly, SCRs may be too high to provide ESD protection. That is, before the trigger voltage is reached, some voltage lower than the trigger voltage may damage the circuit or device requiring ESD protection.

SUMMARY

In view of the foregoing, disclosed herein are embodiments of a semiconductor structure that includes a semiconductor-controlled rectifier with a low trigger voltage.

Generally, embodiments of a semiconductor structure disclosed herein can include a hybrid semiconductor substrate, which has both bulk semiconductor and semiconductor-on-insulator regions. The semiconductor structure can further include a semiconductor-controlled rectifier (SCR). The SCR can include, in a first bulk semiconductor region, a first Pwell and a first Nwell positioned laterally adjacent to the first Pwell. The SCR can include, in a second bulk semiconductor region, a second Nwell. The SCR can include, in a semiconductor-on-insulator region positioned laterally between the first bulk semiconductor region and the second bulk semiconductor region, a second Pwell positioned laterally between and abutting the first Nwell and the second Nwell, an insulator layer on the second Pwell, and a semiconductor layer on the insulator layer. Both the second Nwell and the semiconductor-on-insulator region above the second Pwell can be electrically connected to an anode terminal.

Some embodiments of the semiconductor structure disclosed herein can include a hybrid semiconductor substrate, which has both bulk semiconductor and semiconductor-on-insulator regions. The semiconductor structure can further include a semiconductor-controlled rectifier (SCR). The SCR can include, in a first bulk semiconductor region, a first Pwell and a first Nwell positioned laterally adjacent to the first Pwell. The first Pwell and the first Nwell can be electrically connected to a cathode terminal. The SCR can include, in a second bulk semiconductor region, a second Nwell. The second Nwell can be electrically connected to an anode terminal. The SCR can also include, in a semiconductor-on-insulator region positioned laterally between the first bulk semiconductor region and the second bulk semiconductor region, a second Pwell positioned laterally between and abutting the first Nwell and the second Nwell, an insulator layer on the second Pwell, and a semiconductor layer on the insulator layer. The insulator layer-semiconductor layer stack on the second Pwell effectively forms a gate structure and this gate structure can be electrically connected to the anode terminal in order to lower the SCR trigger voltage.

Optionally, in some embodiments, the gate structure in the SCR can be relatively short in order to minimize parasitic capacitance. More specifically, some embodiments of the semiconductor structure disclosed herein can include a hybrid semiconductor substrate, which has both bulk semiconductor and semiconductor-on-insulator regions. The semiconductor structure can further include a semiconductor-controlled rectifier (SCR). The SCR can include, in a first bulk semiconductor region, a first Pwell, a first P-type contact region on the first Pwell and electrically connected to a cathode terminal, a first Nwell positioned laterally adjacent to the first Pwell, and a first N-type contact region on the first Nwell and electrically connected to the cathode terminal. The SCR can include, in a second bulk semiconductor region, a second Nwell and a second P-type contact region and a second N-type contact region on the second Nwell and electrically connected to an anode terminal. The SCR can also include, in a semiconductor-on-insulator region positioned laterally between the first bulk semiconductor region and the second bulk semiconductor region, a second Pwell positioned laterally between and abutting the first Nwell and the second Nwell, an insulator layer on the second Pwell, and a semiconductor layer on the insulator layer. The insulator layer-semiconductor layer stack on the second Pwell effectively forms a gate structure. This gate structure can be electrically connected to the anode terminal in order to lower the SCR trigger voltage. In such a structure the first P-type contact region, the first N-type contact region, the semiconductor layer, the second P-type contact region, and the second N-type contact region are arranged in parallel stripes separated by and laterally surrounded by isolation regions. Optionally, the first P-type contact region, the first N-type contact region, the second P-type contact region, and the second N-type contact region can have a first length and the semiconductor layer (and thereby the gate structure) can have a second length that is less than the first length in order to minimize parasitic capacitance.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, fails due to electrostatic discharge (ESD) negatively impact the reliability of integrated circuits (ICs). IC designs typically include ESD protection devices (e.g., at input/output pads, at power pads, and between power domains). Such ESD protection devices include, but are not limited to, diodes, transistors, and semiconductor-controlled rectifiers (SCRs) (e.g., silicon-controlled rectifiers). At advanced technology nodes, the trigger voltage of such devices and, particularly, SCRs may be too high to provide ESD protection. That is, before the trigger voltage is reached, some voltage lower than the trigger voltage may damage the circuit or device requiring ESD protection.

In view of the foregoing, disclosed herein are embodiments of a semiconductor structure that includes a semiconductor-controlled rectifier (e.g., for electrostatic discharge (ESD) protection). The SCR can be readily integrated into advanced semiconductor-on-insulator processing technology platforms (e.g., a fully depleted silicon-on-insulator (FDSOI) processing technology platform) that employ hybrid semiconductor substrates (i.e., semiconductor substrates with both bulk semiconductor and semiconductor-on-insulator regions) and is configured with an on-Pwell semiconductor-on-insulator gate structure that is tied to the anode terminal to effectively lower the SCR trigger voltage. In order to fine tune and, more particularly, further lower the trigger voltage of the SCR, the Pwell on which the gate structure sits may be made narrower than the gate structure and/or the doping profile of the Pwell on which the gate structure sits may be graded (e.g., P to P− closer to insulator layer). Additionally, to minimize parasitic capacitance, the gate structure may be shorter in length than contact regions parallel and adjacent thereto.

Figure 1:
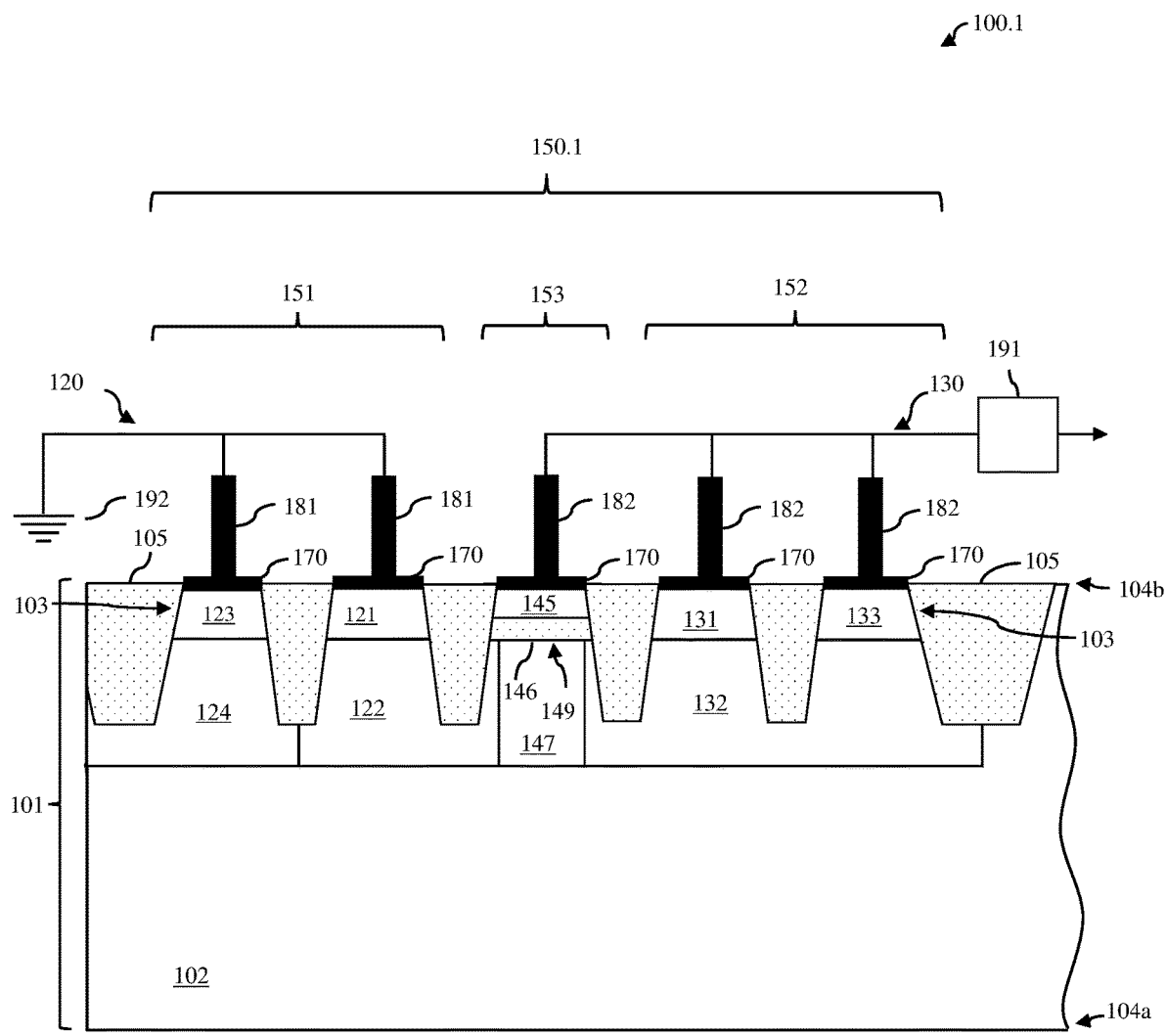
FIG. 1 is a cross-section diagram of an embodiment of a semiconductor structure that includes a semiconductor-controlled rectifier.
Figure 2:
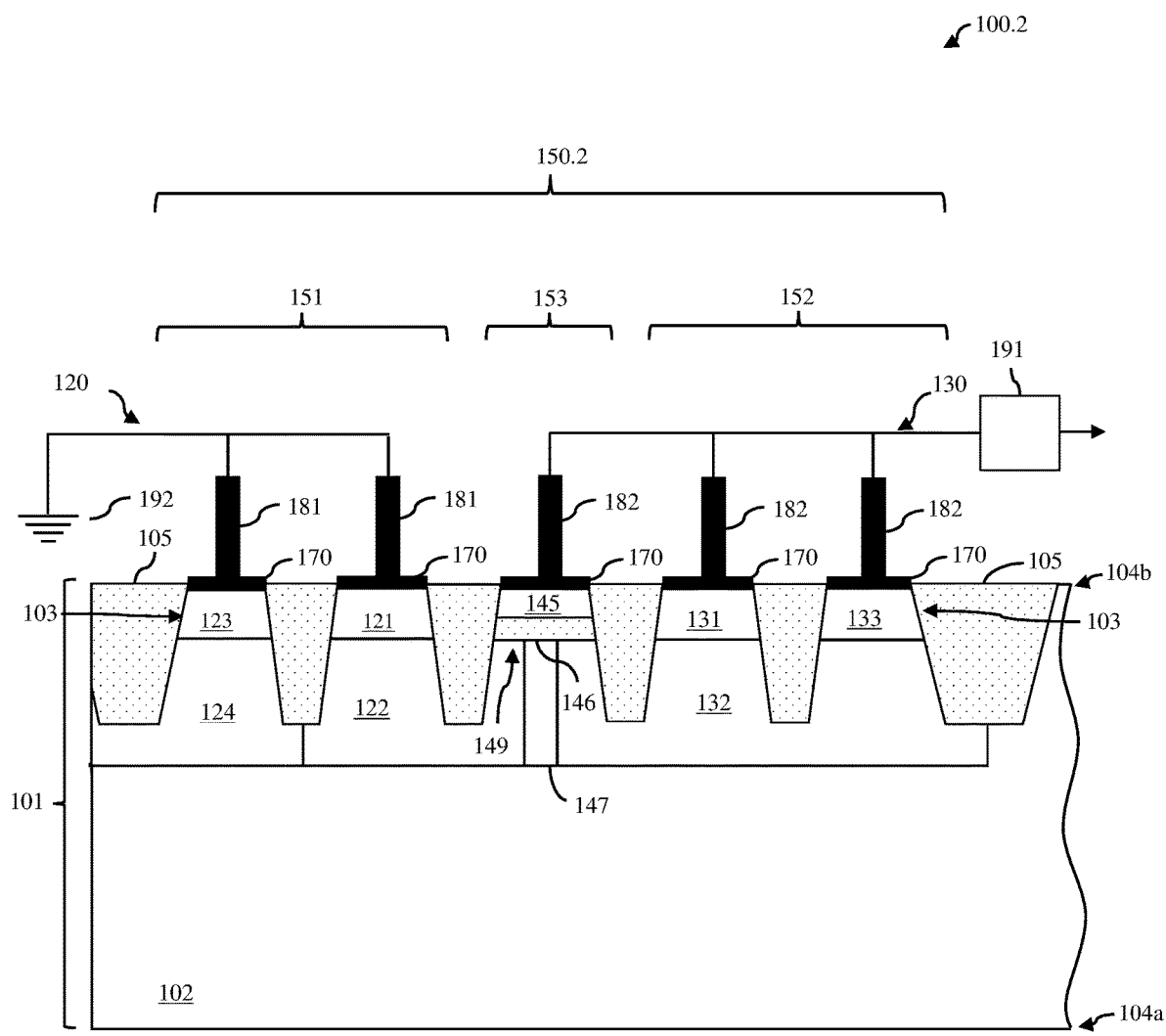
FIG. 2 is a cross-section diagram of another embodiment of a semiconductor structure that includes a semiconductor-controlled rectifier.

More particularly, referring to FIGS. 1-2 disclosed herein are various embodiments of a semiconductor structure 100.1-100.2, respectively. In each of the embodiments, the semiconductor structure 100.1-100.2 can include a hybrid semiconductor substrate 101.

The hybrid semiconductor substrate 101 can be, for example, the type of hybrid semiconductor substrate typically employed in advanced semiconductor-on-insulator technology platforms (e.g., a fully-depleted silicon-on-insulator (FDSOI) technology platform). Specifically, the hybrid semiconductor substrate 101 can include a back side 104a and a front side 104b opposite the back side 104a. The hybrid semiconductor substrate 101 can include a monocrystalline base semiconductor layer 102 having a bottom surface (corresponding to the back side of the hybrid semiconductor substrate) and a top surface opposite the bottom surface. This base semiconductor layer 102 can be, for example, a base silicon layer and can be doped so as to have P-type conductivity at a relatively low conductivity level. That is, the base semiconductor layer 102 could be a P− silicon substrate.

The hybrid semiconductor substrate 101 can include both bulk semiconductor and semiconductor-on-insulator regions across this base semiconductor layer 102. For purposes of illustration only two bulk semiconductor regions 151-152 and one semiconductor-on-insulator region 153 are shown in the figures. However, it should be understood that the figures are not intended to be limiting and that such a hybrid semiconductor substrate 101 may include additional bulk semiconductor and semiconductor-on-insulator regions. Each bulk semiconductor region (e.g., 151-152) of the hybrid semiconductor substrate 101 can include a monocrystalline epitaxial semiconductor layer 103 (e.g., a monocrystalline silicon layer) immediately adjacent to the top surface of the base semiconductor layer 102. Each semiconductor-on-insulator region 153 can include a relatively thick insulator layer 146 (e.g., a relatively thick buried oxide (BOX) layer) on the top surface of the base semiconductor layer 102. The insulator layer 146 can be, for example, at least 10 nm thick (e.g., 20 nm thick or more). Each semiconductor-on-insulator region (e.g., 153) can also include a relatively thin monocrystalline semiconductor layer 145 (e.g., a relatively thin monocrystalline silicon layer, also referred to herein as an SOI layer) on the insulator layer 146. Top surfaces of the epitaxial semiconductor layers in the bulk semiconductor regions and top surface of SOI layers in the semiconductor-on-insulator regions can be essentially co-planar. Alternatively, top surfaces of epitaxial semiconductor layers in the bulk semiconductor regions can be somewhat above or below the level of the top surface of SOI layers in the semiconductor-on-insulator regions. Those skilled in the art will recognize that in advanced semiconductor-on-insulator technology platforms (e.g., the fully-depleted silicon-on-insulator (FDSOI) technology platform) the semiconductor-on-insulator regions are typically used as devices regions (e.g., for fully-depleted planar field effect transistors (FET)). Bulk semiconductor regions can provide a means for accessing well regions below the device regions so that the well regions can be selectively biased (e.g., to adjust the threshold voltages (Vts) of the above FETs). Bulk semiconductor regions can also be use as additional device regions.

In any case, the semiconductor structure 100.1, 100.2 can further include a semiconductor-controlled rectifier (SCR) 150.1, 150.2 (e.g., a silicon-controlled rectifier), which has components in adjacent bulk semiconductor and semiconductor-on-insulator regions. Specifically, in each of the embodiments, the SCR 150.1, 150.2 can include a first bulk semiconductor region 151, a second bulk semiconductor region 152 and a semiconductor-on-insulator region 153 positioned laterally between the first bulk semiconductor region 151 and the second bulk semiconductor region 152.

Within the first bulk semiconductor region 151, the SCR 150.1, 150.2 can include a first Pwell 124 (also referred to herein as a first P-type dopant implant region) in an upper portion of the base semiconductor layer 102. The first Pwell can have a higher P-type conductivity level than a lower portion of the base semiconductor layer 102 below. Within the first bulk semiconductor region 151, the SCR 150.1, 150.2 can further include a first P-type contact region 123 on the top surface of the base semiconductor layer 102 immediately adjacent to the first Pwell 124. The first P-type contact region 123 can have a higher P-type conductivity level than the first Pwell 124. For example, an epitaxial semiconductor layer 103 on the base semiconductor layer 102 over the first Pwell 124 can be a P+ epitaxial silicon layer for the first P-type contact region 123. Within the first bulk semiconductor region 151, the SCR 150.1, 150.2 can further include a first Nwell 122 (also referred to herein as a first N-type dopant implant region) within the upper portion of the base semiconductor layer 102 and positioned laterally immediately adjacent to the first Pwell 124. Within the first bulk semiconductor region 151, the SCR 150.1, 150.2 can further include a first N-type contact region 121 on the top surface of the base semiconductor layer 102 immediately adjacent to the first Nwell 122. The first N-type contact region 121 can have a higher N-type conductivity level than the first Nwell 122. For example, the epitaxial semiconductor layer 103 on the base semiconductor layer 102 above the first Nwell 122 can be an N+ epitaxial silicon layer for the first N-type contact region 121. As illustrated, within the first bulk semiconductor region 151, the first P-type contact region 123 and the first N-type contact region 121 can be isolated from each other by trench isolation regions 105 (e.g., shallow trench isolation (STI) regions) that extend from the front side 104b of the hybrid semiconductor substrate 101 into the upper portion of the base semiconductor layer 102.

Optionally, within the first bulk semiconductor region 151, the SCR 150.1, 150.2 can further include a metal silicide layer 170 on both the first P-type contact regions 123 and the first N-type contact region 121. The metal silicide layers 170 can be, for example, layers of cobalt silicide (CoSi), nickel silicide (NiSi), tungsten silicide (WSi), titanium silicide (TiSi), or any other suitable metal silicide material. In any case, first contacts 181 landing on the first P-type contact region 123 and the first N-type contact region 121 (or the metal silicide layer thereon) can electrically connect the first Pwell 124 and the first Nwell 122, respectively, to a cathode terminal 120 and, thereby to ground.

Within the second bulk semiconductor region 152, the SCR 150.1, 150.2 can include a second Nwell 132 (also referred to herein as a second N-type dopant implant region) within the upper portion of the base semiconductor layer 102. Within the second bulk semiconductor region 152, the SCR 150.1, 150.2 can further include both a second P-type contact region 131 and a second N-type contact region 133 on the top surface of the base semiconductor layer 102 immediately adjacent to the second Nwell 132. The second P-type contact region 131 can have a relatively high P-type conductivity level (e.g., essentially the same as the first P-type contact region 123 and higher than that of the first Pwell 124). The second N-type contact region 133 can similarly have a relatively high N-type conductivity level (e.g., essentially the same as the first N-type contact region 121 and higher than that of the Nwells 122 and 132). For example, epitaxial semiconductor layers 103 on the base semiconductor layer 102 above the second Nwell 132 can include a P+ epitaxial silicon layer for the second P-type contact region 131 and an N+ epitaxial silicon layer for the second N-type contact region 133. As illustrated, within the second bulk semiconductor region 152, the second P-type contact region 131 and the second N-type contact region 133 can be isolated from each other by trench isolation regions 105 (e.g., shallow trench isolation (STI) regions) that extend from the front side 104b of the hybrid semiconductor substrate 101 into the upper portion of the base semiconductor layer 102.

Optionally, within the second bulk semiconductor region 151, the SCR 150.1, 150.2 can further include a metal silicide layer 170 on both the second P-type contact regions 131 and the second N-type contact region 133. The metal silicide layers 170 can be, for example, layers of cobalt silicide (CoSi), nickel silicide (NiSi), tungsten silicide (WSi), titanium silicide (TiSi), or any other suitable metal silicide material. In any case, second contacts 182 landing on the second P-type contact region 131 and the second N-type contact region 133 (or the metal silicide layer thereon) can electrically connect the second Nwell 132 to an anode terminal 130 and, thereby to a positive voltage source 191. For example, in the case of an SCR-type ESD device, this positive voltage source 191 could be an input/output pad, power pad, etc. connected to a device or circuit requiring ESD protection.

Within the semiconductor-on-insulator region 153 (which as mentioned above is positioned laterally between the first bulk semiconductor region 151 and the second bulk semiconductor region 152), the SCR 150.1, 150.2 can include a second Pwell 147 (also referred to herein as a second P-type dopant implant region) within the upper portion of the base semiconductor layer 102 positioned laterally between and abutting the first Nwell 122 and the second Nwell 132. Within the semiconductor-on-insulator region 153, the SCR 150.1, 150.2 can further include an insulator layer 146 on the top surface of the base semiconductor layer 102 immediately adjacent to the second Pwell 147. As mentioned above, the insulator layer 146 in a semiconductor-on-insulator region can be a buried oxide (BOX) layer and can be relatively thick (e.g., can have a thickness of at least 10 nm, such as 20 nm or more). Within the semiconductor-on-insulator region 153, the SCR 150.1, 150.2 can further include a semiconductor layer 145 on the insulator layer 146. As mentioned above, the semiconductor layer 145 can be a relatively thin monocrystalline semiconductor layer 145 (e.g., a relatively thin monocrystalline silicon layer, also referred to herein as an SOI layer). In the SCR 150.1, 150.2, this semiconductor layer 145 can be doped so as to have a relatively high N-type or P-type conductivity level. That is, the semiconductor layer 145 can be either an N+ semiconductor layer or a P+ semiconductor layer. This insulator layer-doped semiconductor layer stack on the second Pwell 147 effectively forms a gate structure 149.

As illustrated, isolation regions 105 (e.g., STI regions) can be positioned laterally adjacent to opposing sides of the gate structure 149 and can extend into the upper portion of the base semiconductor layer 102. That is, the insulator layer 146 and the semiconductor layer 145 thereon can extend laterally between isolation regions 105. An isolation region on one side of the gate structure 149 can isolate the semiconductor layer 145 from the first N-type contact region 121 and an isolation region on the opposite side of the gate structure 149 can isolate the semiconductor layer 145 from the second P-type contact region 131.

Figure 3A:
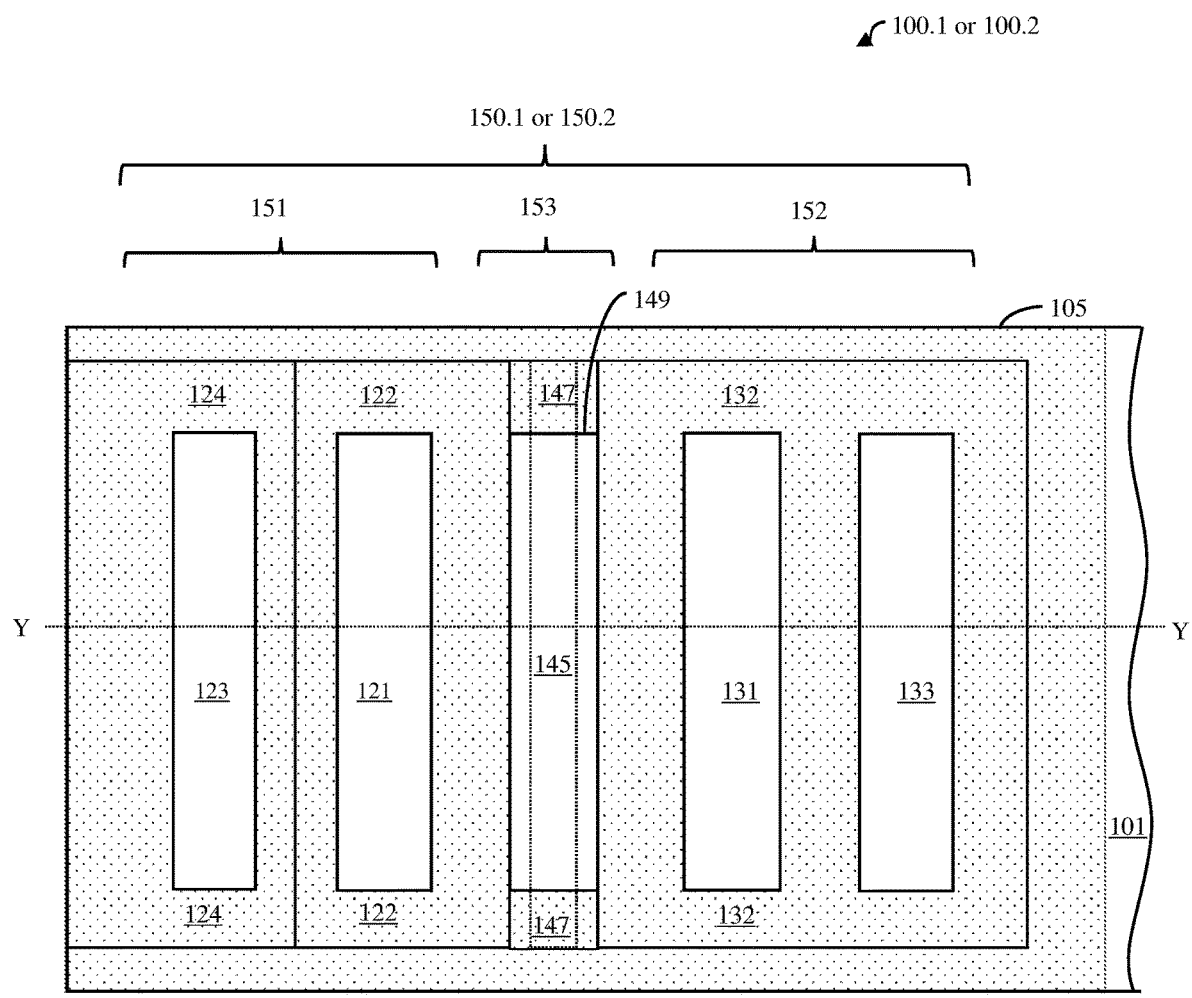
FIGS. 3A and 3B are different layout diagrams illustrating different gate sizes that could be employed in the SCR of FIG. 1 or FIG. 2.
Figure 3B:
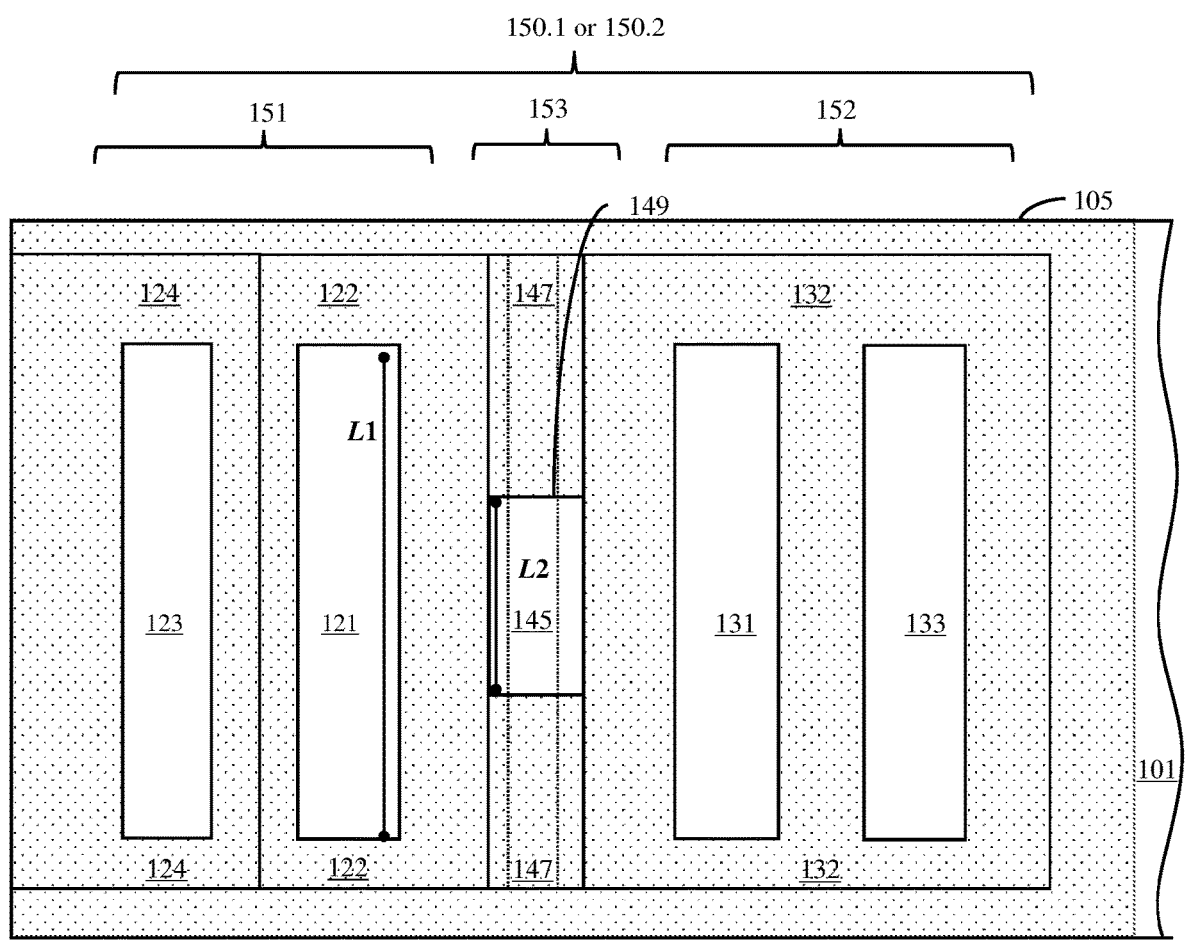

As illustrated in alternative layout diagrams of FIGS. 3A and 3B for the semiconductor structures 100.1-100.2, the well regions described above (including the first Pwell 124, the first Nwell 122, the second Pwell 147, and the second Nwell 132) can be arranged in parallel side-by-side stripes. Furthermore, the first P-type contact region 123 can be a stripe-shaped region above and parallel to the first Nwell 122 and laterally surrounded by isolation regions 105, the first N-type contact region 121 can be a stripe-shaped region above and parallel to the first Nwell 122 and laterally surrounded by isolation regions 105, the semiconductor layer 145 and, thereby the gate structure 149 can be a stripe-shaped region above and parallel to the second Pwell 147 and laterally surrounded by isolation regions 105, and, finally, the second P-type contact region 131 and the second N-type contact region 133 can be stripe-shaped regions above and parallel to the second Nwell 132 with each being laterally surrounded by isolation regions 105. In some embodiments, the length of the semiconductor layer 145 (and thereby the length of the gate structure 149), as measured in a direction parallel to the contact regions 123, 121, 131, 133 can be essentially the same as the lengths of the contact regions (see FIG. 3A). In other embodiments, the length of the semiconductor layer 145 (and thereby the length of the gate structure 149) can be shorter than the lengths of the contact regions 123, 121, 131, 133 in order to minimize parasitic capacitance (see FIG. 3B). That is, alternatively, the first P-type contact region 123, the first N-type contact region 121, the second P-type contact region 131, and the second N-type contact region 133 can have a first length (L1) and but the semiconductor layer 145 (and thereby the gate structure 149) can have a second length (L2) that is less than the first length in order to minimize parasitic capacitance. The design decision to reduce the length of the gate structure can be based on a cost-benefit analysis weighing the added manufacturing complexity against performance improvement due to the reduction in parasitic capacitance.

In any case, the gate structure 149 may be tied to the anode terminal 130 in order to lower the SCR trigger voltage. More specifically, within the semiconductor-on-insulator region 153, the SCR 150.1, 150.2 can include a metal silicide layer 170 on the semiconductor layer 145. As mentioned above, metal silicide layers 170 can be, for example, layers of cobalt silicide (CoSi), nickel silicide (NiSi), tungsten silicide (WSi), titanium silicide (TiSi), or any other suitable metal silicide material. Furthermore, an additional second contact 182 tied to the anode terminal 130 can land on the semiconductor layer 145 (or the metal silicide layer thereon) coupling the gate structure 149 to the anode terminal 130 and, thereby to the positive voltage source 191.

Those skilled in the art will understand that typically SCR will turn on when the voltage level at the anode terminal rises above a trigger voltage, thereby allowing current to flow through the SCR from the anode terminal to the cathode terminal. When an SCR is designed as an ESD protection device, it will turn on and shunt current flow away from circuit or device being protected when the voltage level at the anode terminal 130 (e.g., at an input/output pad, power pad, etc.) is high enough to cause damage to the circuit or device being protected. In the disclosed embodiments, an N-type field effect transistor (NFET) is effectively formed with the second Pwell 147 being a channel region, with the insulator layer-semiconductor layer stack being the gate structure 149 adjacent to the channel region, and with the first Nwell 122 and the second Nwell 132 being source/drain regions on opposing sides of the channel region. When the voltage level on the gate structure 149 reaches a given voltage level (i.e., the SCR trigger voltage level), the NFET and thereby the SCR turns on. By electrically connecting the gate structure 149 to the anode terminal 130, the NFET and thereby the SCR will turn on quickly and at a lower voltage level than if no gate structure were employed.

It should be noted that adjustments can also be made to the design of the second Pwell 147 in order to fine tune the SCR trigger voltage to a desired level.

Specifically, adjustments can be made to the size of the second Pwell 147 to fine tune the SCR trigger voltage. For example, the width of the second Pwell 147, as measured between the first Nwell 122 and the second Nwell 132, can be essentially the same as the width of the gate structure 149 as measured in the same direction (see the SCR 150.1 in the semiconductor structure 100.1 of FIG. 1). Alternatively, the width of the second Pwell 147, as measured between the first Nwell 122 and the second Nwell 132, can be reduced so that it is narrower than the width of the gate structure 149, as measured in the same direction (see the SCR 150.2 in the semiconductor structure 100.2 of FIG. 2). For example, the second Pwell 147 can be patterned during processing so that it is relatively narrow (e.g., ¾, ½, ⅓, etc. the width of the gate structure 149). In this case, the gate structure 149 (including the insulator layer-semiconductor layer stack) will be wider than the second Pwell and, thus, will extend laterally over the junctions between the second Pwell 147 and both the first Nwell 122 and the second Nwell 132. As mentioned above, in the disclosed embodiments, an NFET is effectively formed with the second Pwell 147 being a channel region, with the insulator layer-semiconductor layer stack being the gate structure 149 adjacent to the channel region, and with the first Nwell 122 and the second Nwell 132 being source/drain regions. By narrowing the width of the second Pwell 147, ss measured between the first Nwell 122 and the second Nwell 132, the channel length of this NFET between the source/drain regions is reduced lowering the NFET threshold voltage (Vt) and thereby lowering the SCR trigger voltage.

Figure 4A:
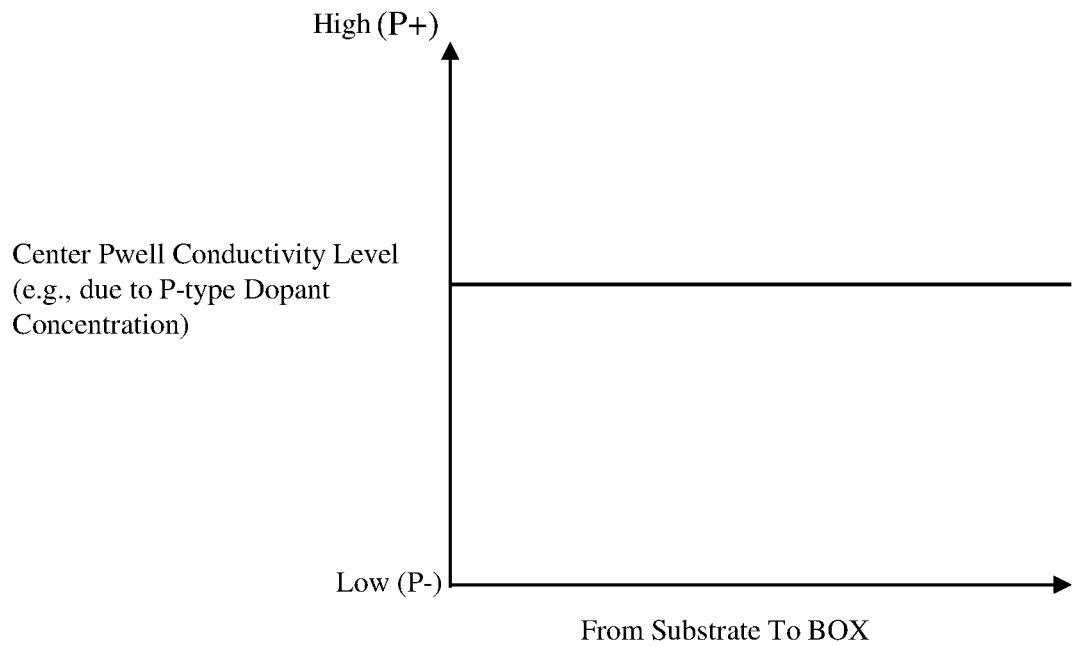
FIGS. 4A-4C are graphs illustrating different doping profiles that could be employed for the second Pwell in the SCR of FIG. 1 or FIG. 2.
Figure 4B:
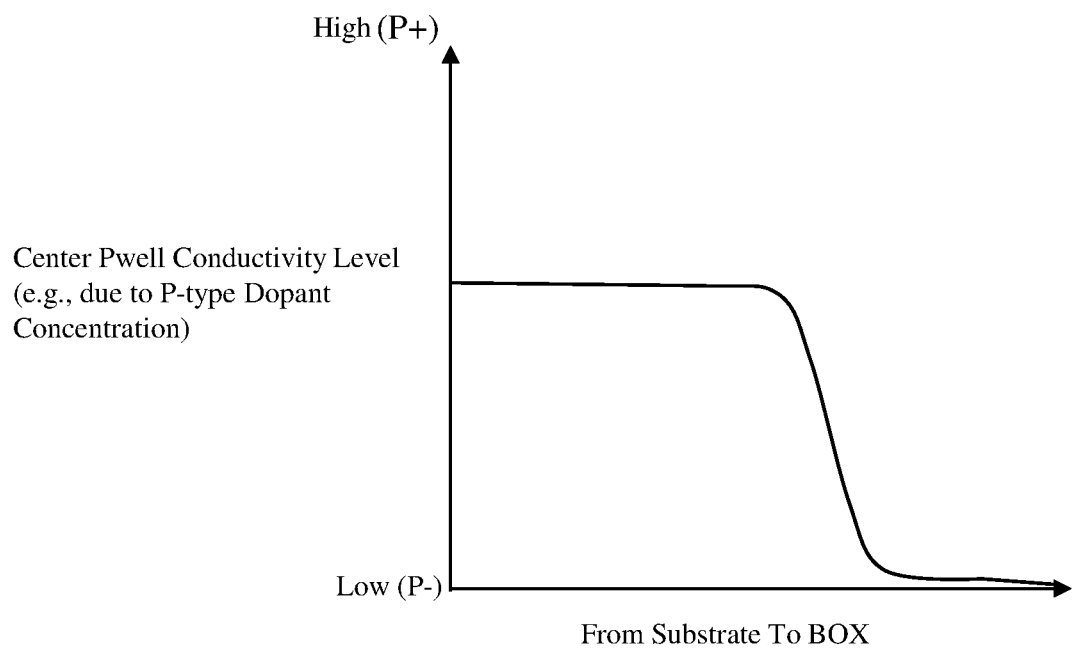
Figure 4C:
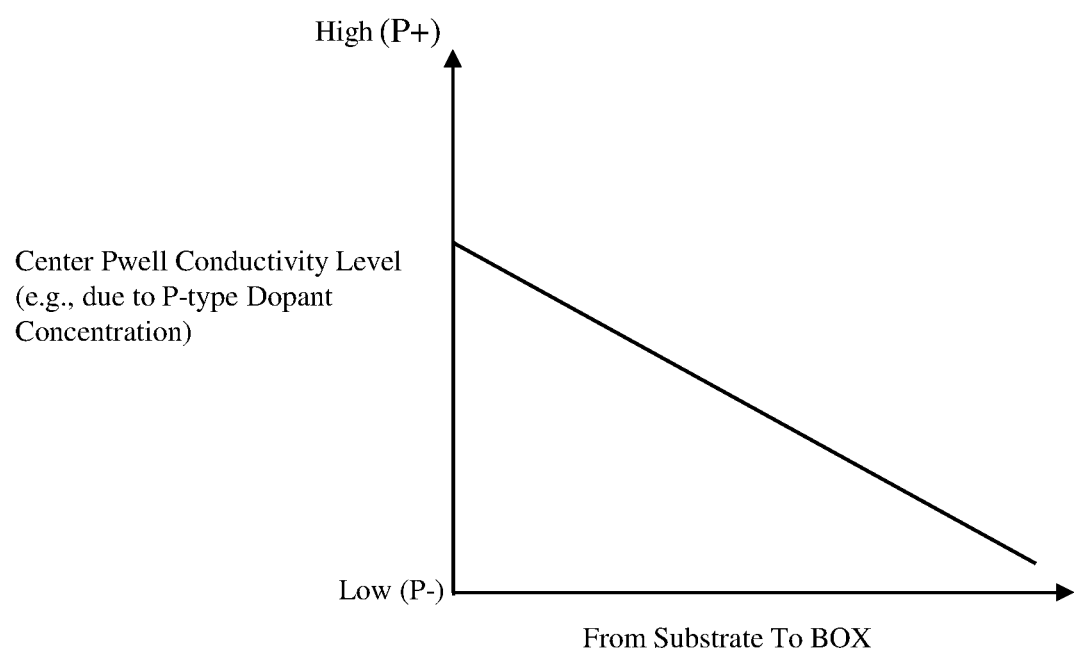

Adjustments can also be made to the dopant profile and corresponding conductivity level of the second Pwell 147 to fine tune the SCR trigger voltage. For example, the second Pwell 147 can have an essentially uniform P-type dopant profile both vertically between the lower portion of the P– base semiconductor layer and the insulator layer 146 (e.g., see FIG. 4A) and horizontally between the first Nwell 122 and the second Nwell 132. In this case, the second Pwell 147 can have a higher P-type conductivity level than the lower portion of the P– base semiconductor layer 102. Alternatively, the second Pwell 147 could have a P-type dopant profile and corresponding P-type conductivity level that varies vertically and/or horizontally. For example, the second Pwell 147 could have a relatively high P-type conductivity level (P) adjacent to the lower portion of the P– base semiconductor layer 102 and a relatively low P-type conductivity level (P–) adjacent to the insulator layer 146. The change in the conductivity level can be stepped (e.g., see FIG. 4B), linear (e.g., see FIG. 4C), etc. By reducing the P-type dopant level and thereby the P-type conductivity level closer to the insulator layer 146 (i.e., just below the gate structure 149), the NFET Vt and thereby the SCR trigger voltage can be lowered. The exemplary dopant profiles shown in FIGS. 4A-4C are provided for illustration purposes only and are not intended to be limiting. Alternative doping profiles could be employed for the second Pwell 147 in order to selectively adjust the NFET Vt and thereby the SCR trigger voltage. As mentioned above, the doping profiles can vary vertically (e.g., as shown in FIGS. 4A-4C) and/or horizontally.

Design decisions related to the size and/or dopant profile of the second Pwell can be based on a cost-benefit analysis weighing the added manufacturing complexity against the need to lower the SCR trigger voltage.

Figure 5:
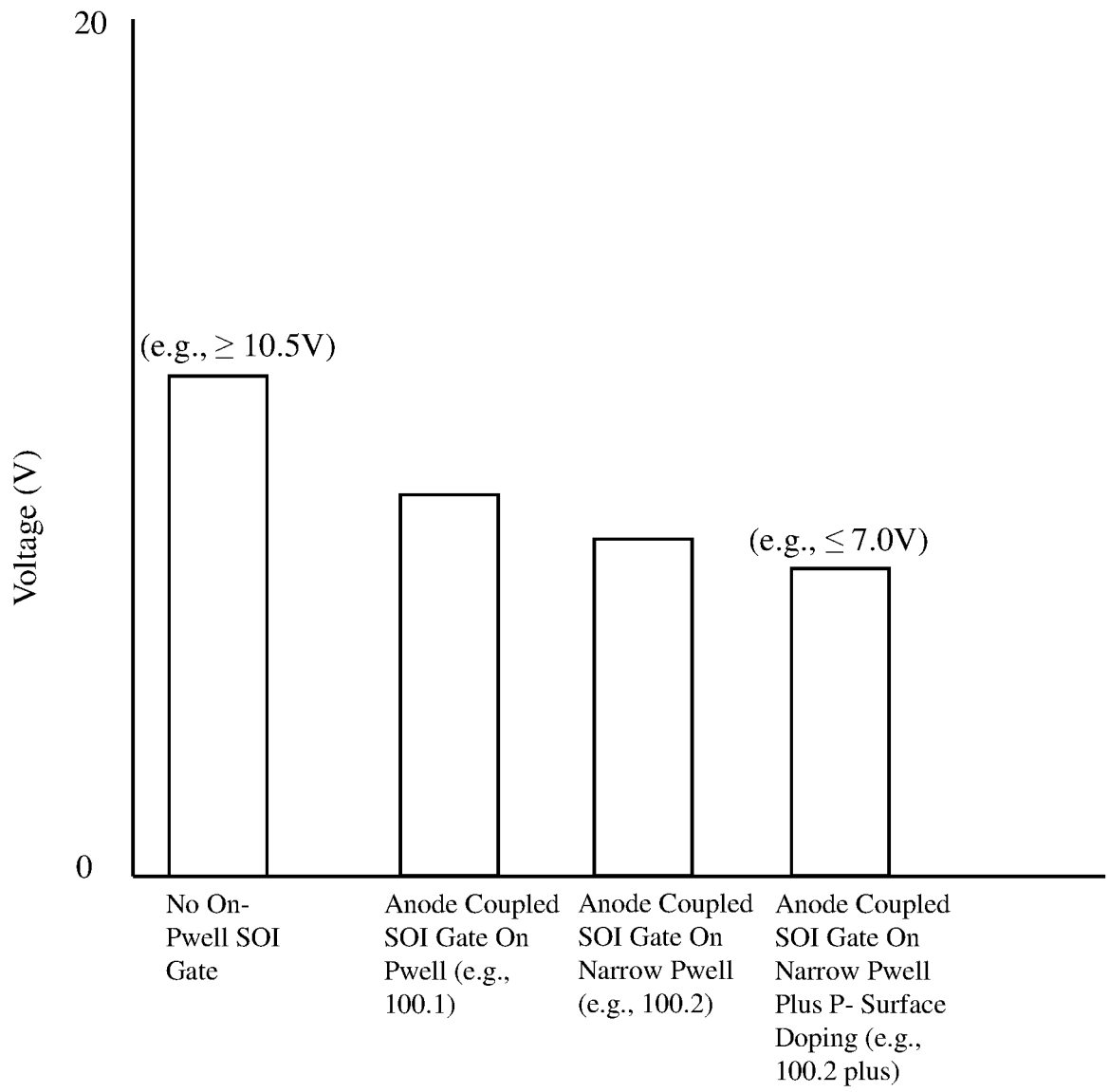
FIG. 5 is a bar graph illustrating SCR trigger voltage improvement.

FIG. 5 is a bar graph illustrating an exemplary SCR trigger voltage (e.g., greater than or equal to 10.5V) in conventional SCR devoid of an on-Pwell SOI gate structure as well as the potential reduction in SCR trigger voltage that can be achieved by incorporating such on-Pwell SOI gate structure connected to the anode terminal and, optionally, making modifications (e.g., adjusting the size of the Pwell, and/or adjusting to the doping profile of the Pwell) to further reduce the SCR trigger voltage (e.g., down to 7.0V or less). It should be noted that, since the gate structure 149 is not a conventional gate structure with a thin gate dielectric layer and polysilicon or metal gate, but instead incorporates a thick insulator layer (e.g., a BOX layer) of at least 10 nm (e.g., 20 nm or more) and a monocrystalline semiconductor layer (e.g., a monocrystalline silicon layer), the risk of dielectric breakdown and, thereby a device fail is minimized.

It should be understood that in the structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a hybrid semiconductor substrate comprising bulk semiconductor and semiconductor-on-insulator regions; and
   a semiconductor-controlled rectifier comprising:
      in a first bulk semiconductor region, a first Pwell and a first Nwell positioned laterally adjacent to the first Pwell;
      in a second bulk semiconductor region, a second Nwell electrically connected to an anode terminal; and
      in a semiconductor-on-insulator region positioned laterally between the first bulk semiconductor region and the second bulk semiconductor region, a second Pwell positioned laterally between and abutting the first Nwell and the second Nwell, an insulator layer on the second Pwell, and a semiconductor layer on the insulator layer positioned laterally between and abutting trench isolation regions, and electrically connected to the anode terminal.

2. The structure of claim 1, wherein the hybrid semiconductor substrate has a back side and a front side opposite the back side and wherein the semiconductor-controlled rectifier further comprises:
   a first P-type contact region on the first Pwell at the front side of the hybrid semiconductor substrate;
   a first N-type contact region on the first Nwell at the front side of the hybrid semiconductor substrate; and
   a second P-type contact region and a second N-type contact region on the second Nwell at the front side of the hybrid semiconductor substrate.

3. The structure of claim 2, wherein the first P-type contact region and the second P-type contact region have a higher P-type conductivity level than the first Pwell and the second Pwell and wherein the first N-type contact region and the second N-type contact region have a higher N-type conductivity level than the first Nwell and the second Nwell.

4. The structure of claim 2, further comprising: trench isolation regions positioned laterally between and abutting the first P-type contact region and the first N-type contact region, positioned laterally between and abutting the first N-type contact region and the semiconductor layer, positioned laterally between and abutting the semiconductor layer and the second P-type contact region, and positioned laterally between and abutting the second P-type contact region and the second N-type contact region.

5. The structure of claim 1, wherein the semiconductor layer comprises conductive monocrystalline silicon and wherein the insulator layer comprises a buried oxide layer having a thickness over 10 nm.

6. The structure of claim 1, wherein the semiconductor layer has any one of N-type conductivity and P-type conductivity.

7. A structure comprising:
a hybrid semiconductor substrate comprising bulk semiconductor and semiconductor-on-insulator regions; and
a semiconductor-controlled rectifier on the hybrid semiconductor substrate and comprising:
in a first bulk semiconductor region, a first Pwell and a first Nwell positioned laterally adjacent to the first Pwell, wherein the first Pwell and the first Nwell are electrically connected to a cathode terminal;
in a second bulk semiconductor region, a second Nwell electrically connected to an anode terminal; and
in a semiconductor-on-insulator region positioned laterally between the first bulk semiconductor region and the second bulk semiconductor region, a second Pwell positioned laterally between and abutting the first Nwell and the second Nwell, an insulator layer on the second Pwell, and a semiconductor layer on the insulator layer positioned laterally between and abutting trench isolation regions,
wherein the insulator layer and the semiconductor layer form a gate structure on the second Pwell, and
wherein the gate structure is electrically connected to the anode terminal.

8. The structure of claim 7, wherein the hybrid semiconductor substrate has a back side and a front side opposite the back side and wherein the semiconductor-controlled rectifier further comprises:
a first P-type contact region on the first Pwell at the front side of the hybrid semiconductor substrate;
a first N-type contact region on the first Nwell at the front side of the hybrid semiconductor substrate;
first contacts electrically connected to the cathode terminal and on the first P-type contact region and the first N-type contact region;
a second P-type contact region and a second N-type contact region on the second Nwell at the front side of the hybrid semiconductor substrate; and
second contacts electrically connected to the anode terminal and on the semiconductor layer, the second P-type contact region and the second N-type contact region.

9. The structure of claim 8, wherein the first P-type contact region, the first N-type contact region, the semiconductor layer, the second P-type contact region and the second N-type contact region are arranged in parallel stripes with essentially equal lengths and are separated by isolation regions.

10. The structure of claim 8, wherein the first P-type contact region and the second P-type contact region have a higher P-type conductivity level than the first Pwell and the second Pwell and wherein the first N-type contact region and the second N-type contact region have a higher N-type conductivity level than the first Nwell and the second Nwell.

11. The structure of claim 8, further comprising: trench isolation regions positioned laterally between and abutting the first P-type contact region and the first N-type contact region, positioned laterally between and abutting the first N-type contact region and the semiconductor layer, positioned laterally between and abutting the semiconductor layer and the second P-type contact region, and positioned laterally between and abutting the second P-type contact region and the second N-type contact region.

12. The structure of claim 8,
wherein the hybrid semiconductor substrate has a lower portion between the back side and the first Pwell, the first Nwell, the second Pwell, and the second Nwell,
wherein the lower portion of the hybrid semiconductor substrate has P-type conductivity at a lower P-type conductivity level than the first Pwell, and
wherein the second Pwell has any one of:
an essentially uniform P-type dopant profile and a higher P-type conductivity level than the lower portion of the hybrid semiconductor substrate; and
a graded P-type dopant profile with a relatively high P-type conductivity level adjacent to the lower portion of the hybrid semiconductor substrate and a relatively low P-type conductivity level adjacent to the insulator layer.

13. The structure of claim 8, wherein the semiconductor layer comprises conductive monocrystalline silicon with any one of P-type conductivity and N-type conductivity and wherein the insulator layer comprises a buried oxide layer having a thickness over 10 nm.

14. The structure of claim 8, wherein the semiconductor layer and the insulator layer are wider than the second Pwell so as to extend laterally over junctions between the second Pwell and both the first Nwell and the second Nwell.

15. A structure comprising:
a hybrid semiconductor substrate comprising bulk semiconductor and semiconductor-on-insulator regions; and
a semiconductor-controlled rectifier on the hybrid semiconductor substrate and comprising:
in a first bulk semiconductor region, a first Pwell, a first P-type contact region on the first Pwell and electrically connected to a cathode terminal, a first Nwell positioned laterally adjacent to the first Pwell, and a first N-type contact region on the first Nwell and electrically connected to the cathode terminal;
in a second bulk semiconductor region, a second Nwell and a second P-type contact region and a second N-type contact region on the second Nwell and electrically connected to an anode terminal; and
in a semiconductor-on-insulator region positioned laterally between the first bulk semiconductor region and the second bulk semiconductor region, a second Pwell positioned laterally between and abutting the first Nwell and the second Nwell, an insulator layer on the second Pwell, and a semiconductor layer on the insulator layer,
wherein the semiconductor layer is a monocrystalline semiconductor layer,
wherein the insulator layer and the semiconductor layer form a gate structure on the second Pwell,
wherein the gate structure is electrically connected to the anode terminal,
wherein the first P-type contact region, the first N-type contact region, the semiconductor layer, the second P-type contact region, and the second N-type contact region are arranged in parallel stripes each positioned laterally between and abutting trench isolation regions,
wherein the first P-type contact region, the first N-type contact region, the second P-type contact region, and the second N-type contact region have a first length, and
wherein the semiconductor layer has a second length that is less than the first length.

16. The structure of claim 15, wherein the semiconductor-controlled rectifier further comprises:
first contacts electrically connected to the cathode terminal and on the first P-type contact region and the first N-type contact region; and second contacts electrically connected to the anode terminal and on the semiconductor layer, the second P-type contact region and the second N-type contact region.

17. The structure of claim 15, wherein the first P-type contact region and the second P-type contact region have a higher P-type conductivity level than the first Pwell and the second Pwell and wherein the first N-type contact region and the second N-type contact region have a higher N-type conductivity level than the first Nwell and the second Nwell.

18. The structure of claim 15,
wherein the hybrid semiconductor substrate has a back side, a front side opposite the back side, and a lower portion between the back side and the first Pwell, the first Nwell, the second Pwell, and the second Nwell,
wherein the lower portion of the hybrid semiconductor substrate has P-type conductivity at a lower P-type conductivity level than the first Pwell, and
wherein the second Pwell has any one of:

an essentially uniform P-type dopant profile and a higher P-type conductivity level than the lower portion of the hybrid semiconductor substrate; and a graded P-type dopant profile with a relatively high P-type conductivity level adjacent to the lower portion of the hybrid semiconductor substrate and a relatively low P-type conductivity level adjacent to the insulator layer.

19. The structure of claim 15, wherein the semiconductor layer comprises conductive monocrystalline silicon with any one of P-type conductivity and N-type conductivity and wherein the insulator layer comprises a buried oxide layer having a thickness over 10 nm.

20. The structure of claim 15, wherein the semiconductor layer and the insulator layer are wider than the second Pwell so as to extend laterally over junctions between the second Pwell and both the first Nwell and the second Nwell.

* * * * *